(12) United States Patent  
Folker et al.

(10) Patent No.: US 8,498,124 B1  
(45) Date of Patent: Jul. 30, 2013

(54) MAGNETIC CIRCUIT BOARD STACKING COMPONENT

(75) Inventors: Donald Folker, Madison, AL (US); Mark Bauer, Harlingen, TX (US); Travis Berry, Madison, AL (US); Mike LeBlanc, Huntsville, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 309 days.

(21) Appl. No.: 12/634,852

(22) Filed: Dec. 10, 2009

(51) Int. Cl.
*H05K 1/14* (2006.01)

(52) U.S. Cl.
USPC ............ 361/742; 361/803; 361/740; 361/836

(58) Field of Classification Search
USPC ................................... 361/742, 803, 836, 74
See application file for complete search history.

(56) References Cited

U.S. PATENT DOCUMENTS

| | | | | |
|---|---|---|---|---|
| 3,323,091 | A | * | 5/1967 | Hibbits ........................ 336/84 R |
| 3,950,060 | A | * | 4/1976 | Stipanuk et al. .............. 439/329 |
| 4,661,792 | A | * | 4/1987 | Watkins .......................... 336/65 |
| 5,334,029 | A | * | 8/1994 | Akkapeddi et al. ............. 439/66 |
| 5,670,925 | A | * | 9/1997 | Gibbs ........................... 336/208 |
| 5,917,709 | A | | 6/1999 | Johnson et al. |
| 5,923,526 | A | * | 7/1999 | Kangas .......................... 361/627 |
| 5,986,887 | A | | 11/1999 | Smith et al. |
| 6,241,531 | B1 | | 6/2001 | Roath et al. |
| 6,420,953 | B1 | | 7/2002 | Dadafshar |
| 6,628,531 | B2 | | 9/2003 | Dadafshar |
| 2004/0239464 | A1 | * | 12/2004 | Mihara et al. ................... 336/83 |

FOREIGN PATENT DOCUMENTS

WO 0243087 5/2002

* cited by examiner

*Primary Examiner* — Tuan T Dinh
*Assistant Examiner* — Steven Sawyer
(74) *Attorney, Agent, or Firm* — Waddey & Patterson, P.C.; Mark J. Patterson; Matthew C. Cox

(57) ABSTRACT

A magnetic component provides both electrical interconnectivity and mechanical support between stacked circuit boards. The magnetic component includes a bobbin structure and a magnetically permeable core. The bobbin structure includes an upper bobbin pin rail and a lower bobbin pin rail. The upper bobbin pin rail includes one or more upper bobbin pins extending from the upper bobbin pin rail. Each upper bobbin pin may be adapted for soldering onto a first circuit board. At least one lower bobbin pin extends from the lower bobbin pin rail. Each lower bobbin pin may also be adapted for soldering onto a second circuit board, forming a circuit board assembly. Each soldered connection between a bobbin pin and a circuit board may provide an electrical connection between the circuit board and the magnetic component. Each soldered connection may also provide a mechanical attachment between a printed circuit board and the magnetic component. A conductive coil is positioned on the bobbin structure and may be connected to an upper or lower bobbin pin. The core is positioned near the conductive coil for providing an electrical connection between the circuit boards through magnetic coupling.

13 Claims, 3 Drawing Sheets

MAGNETIC CIRCUIT BOARD STACKING COMPONENT

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

This application claims benefit of the following patent application(s) which is/are hereby incorporated by reference: None

BACKGROUND OF THE INVENTION

The present invention relates generally to a device for mechanically supporting and electrically connecting two or more circuit boards. More specifically, the present invention relates to a magnetic component having a bobbin structure adapted for mechanically stacking two circuit boards while providing an electrical connection between the two circuit boards.

Components for electrically interconnecting stacked circuit boards are known in the art. These components generally include electrical sockets, plugs and pin connectors and are commonly used in electronic devices and circuits having more than one circuit board. Similarly, mechanical devices for stacking multiple circuit boards, including standoffs and spacers, are known in the art.

Generally, prior art stacked circuit board configurations include both a mechanical standoff device and at least one separate electrical connector. Typically, the mechanical standoff device provides structural support for the upper and lower circuit boards. At least two mechanical standoff devices are generally necessary when two circuit boards are stacked. One mechanical device is placed at an end of each circuit board to provide uniform separation between the two boards for accommodating other electrical components on each board. In such a configuration, at least one electrical connector is placed between stacked circuit boards to provide a pathway for electrical signals between the boards.

Conventional stacked circuit board configurations typically include both mechanical and electrical connectors as separate components, thereby increasing the overall cost and complexity of the electronic device. Mechanical standoff devices including integrated electrical connectors are also known in the art. These devices provide both mechanical support and electrical connectivity between stacked circuit boards. Such devices are generally used in electronic applications requiring a minimized electronic device profile. However, integrated standoff devices for providing both mechanical and electrical connectivity form additional circuit components that increase cost. Mechanical and electrical connectors for stacked circuit boards also add complexity to circuits and provide additional modes of electronic device failure, including electronic terminal disconnection or mechanical standoff dislocation.

Magnetic components are also known in the prior art. Typically magnetic circuit components, such as transformers and inductors, include at least one conductive coil, or winding, positioned around a core made of a magnetically permeable material, commonly a ferrite. In many electronic applications, the conductive coil is wound around a bobbin. The core typically provides electrical communication through magnetic coupling between separate windings placed around the core.

Prior art magnetic components also generally include electrical terminal connectors extending from the bottom of the component for surface-mounting onto a printed circuit board. In conventional stacked circuit board configurations, if a second circuit board is stacked above a first circuit board having a magnetic component surface-mounted thereon, the placement of the terminal connectors on the bottom of the magnetic component requires the use of a separate electrical connector to electrically connect the magnetic component to the second circuit board. Further, a magnetic component, such as a transformer, is commonly the tallest component in an electrical circuit, including a power supply circuit. In these applications, stacking circuit boards requires the use of taller mechanical and electrical connectors to provide sufficient spacing between the boards to accommodate the surface-mounted magnetic components. The use of taller electrical connectors and mechanical standoffs in prior art stacked circuit configurations, especially in power supply circuits including larger transformers, further increases the costs associated with stacking multiple circuit boards.

One common circuit board configuration includes a circuit board substrate having a pattern of conductive material printed directly onto one side of the circuit board. This type of circuit board configuration is generally referred to as a single-sided printed circuit board. Another common circuit board configuration includes a circuit board substrate having conductive material printed directly onto both sides of the circuit board, also known as a double-sided printed circuit board. In many electronic applications, only a small part of the overall circuit requires the use of a double-sided printed circuit board. However, because conventional electronic devices seek to avoid using multiple boards in a single circuit whenever possible, prior art circuit board configurations often include a double-sided printed circuit board for an entire circuit, even where only a small portion of the circuit requires a double-sided printed circuit board for functionality. The prior art practice of using double-sided printed circuit boards in unnecessary circuit locations further increases the complexity and cost of electronic devices.

Accordingly, there is a need in the art for providing a magnetic circuit board stacking component for mechanically stacking two or more circuit boards while providing an electrical connection between the circuit boards, for reducing the modes of electronic device failure by removing unnecessary connectors, for allowing the use of single- and double-sided printed circuit boards in the same circuit, and for reducing both the electronic device profile and the overall cost.

BRIEF SUMMARY OF THE INVENTION

The present invention is a magnetic component having a bobbin structure adapted for stacking two or more circuit boards. The magnetic component provides a mechanical support for the stacked circuit boardS and provides an electrical connection between the boards. The magnetic component can also be a functioning circuit element, such as a transformer. The magnetic component generally includes a conductive coil disposed about the bobbin structure and a magnetically permeable core positioned on the bobbin structure adjacent to or surrounded by the conductive coil. A second conductive coil may also be positioned on the bobbin structure. The magnetic component provides electrical interconnectivity between the upper and lower stacked printed circuit boards through magnetic coupling between the first and second conductive coils. Additionally, a separate electrical connector may be embedded within the bobbin structure to provide a direct electrical connection between the upper and lower circuit boards.

The bobbin structure generally includes an upper bobbin pin support or rail for supporting the first circuit board and a lower bobbin pin support or rail for supporting the second circuit board. Typically, at least one conductive bobbin pin extends from each of the upper and the lower bobbin pin rails. In one embodiment, the bobbin pins are adapted for soldering onto a printed circuit board. Each of the bobbin pins may be adapted for inserting into a terminal via located on either printed circuit board for surface-mounting. In another embodiment, a circuit board assembly includes a first circuit board, a second circuit board and two or more magnetic stacking components. The magnetic components provide separation between the first and second stacked circuit boards to accommodate additional electronic circuit components located on each circuit board.

It is therefore a general objective of the present invention to provide a magnetic component for stacking two or more circuit boards while providing an electrical connection between the boards.

It is another object of the present invention to provide a magnetic component for stacking two or more printed circuit boards while providing magnetic isolation between the two boards.

It is yet another object of the present invention to provide a magnetic circuit board stacking device for providing an electrical connection through magnetic coupling between stacked circuit boards.

It is yet another object of the present invention to provide a magnetic device for stacking a single-sided printed circuit board and a double-sided printed circuit board.

It is yet another object of the present invention to provide a magnetic component for stacking two circuit boards where the magnetic component is a functional circuit component.

It is yet another object of the present invention to provide a magnetic component for stacking printed circuit boards and reducing the cost of the overall electronic device.

Numerous other objects features and advantageous of the present invention will be readily apparent to those skilled in the art upon a reading of the following disclosure when taken in conjunction with the accompanying drawings.

DETAILED DESCRIPTION

Figure 1:
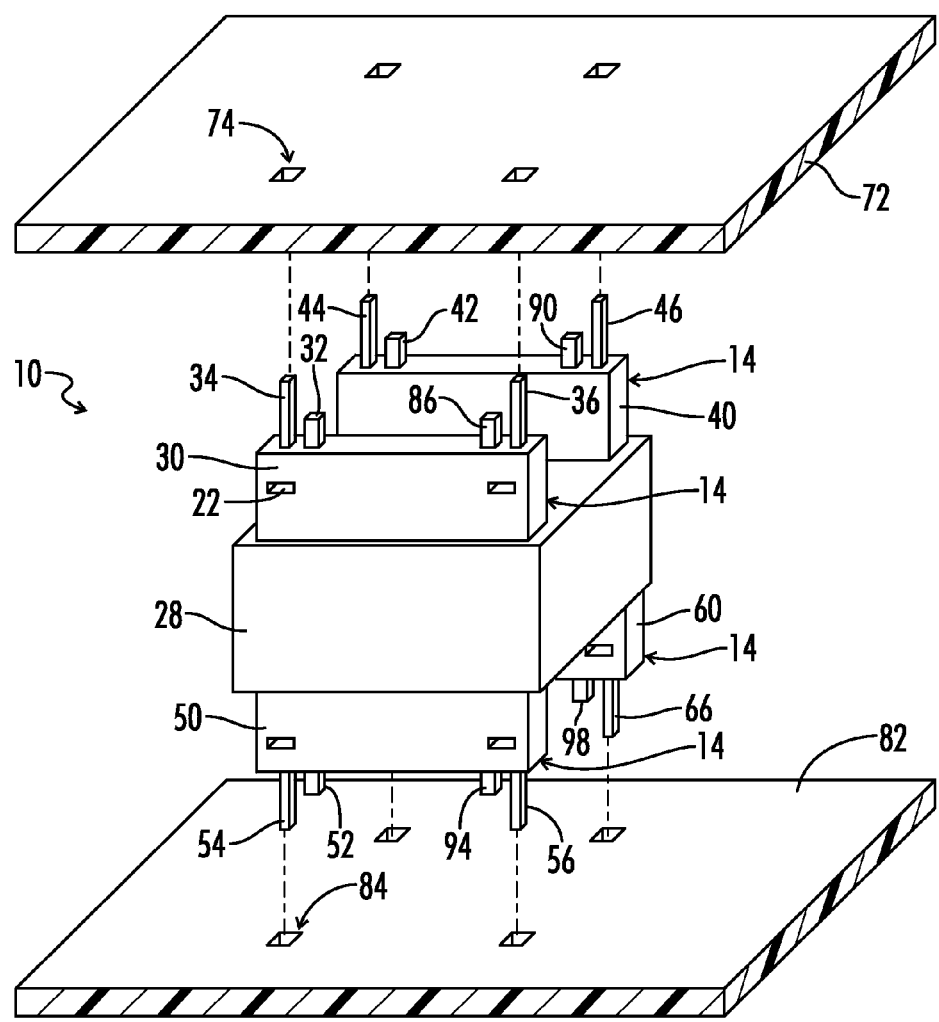
FIG. 1 is a perspective view of a magnetic circuit board stacking component in accordance with the present invention.

Referring now to FIG. 1, there is shown generally one embodiment of a magnetic circuit board stacking component 10 in accordance with the present invention. A magnetic component generally is a component for an electric circuit including a magnetically permeable material, such as a ferrite. The magnetic component 10 shown in FIG. 1 includes a bobbin structure 14 and a core 28. In one embodiment, the core 28 is made of a ferrite and is positioned around the bobbin structure 14. In one embodiment, the bobbin structure 14 includes a first upper bobbin pin support rail 30 and a first lower bobbin pin support rail 50. The bobbin structure 14 may also include a second upper bobbin pin rail 40 and a second lower bobbin pin rail 60. In one embodiment, a first upper bobbin pin 34 extends from the first upper bobbin pin rail 30 and a second upper bobbin pin 44 extends from the second upper bobbin pin rail 40. Each bobbin pin is made of a conductive material. A third upper bobbin pin 36 extends from the first upper bobbin pin rail 30 and a fourth upper bobbin pin 46 extends from the second upper bobbin pin rail 40. Each upper bobbin pin 34, 44, 36, 46 generally extends in the same direction away from the bobbin structure 14. In other embodiments in accordance with the present invention, fewer or additional upper bobbin pins may extend from the bobbin structure 14.

In one embodiment, each upper bobbin pin 34, 44, 36, 46 has a size and shape that adapts it for inserting into a terminal via 74 located on the first circuit board 72. Each upper bobbin pin 34, 44, 36, 46 may be attached to the first circuit board 72 by a soldered connection. In other embodiments in accordance with the present invention, an upper bobbin pin can be inserted into a socket connector located on the first circuit board 72. In other embodiments, both a soldered connection and a terminal socket connection can be used to provide electrical and mechanical connection between the upper bobbin pins 34, 44, 36, 46 and the first circuit board 72.

Figure 2:
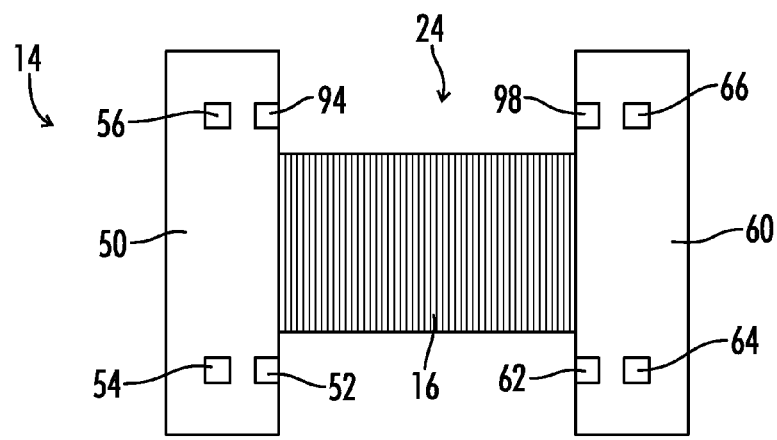
FIG. 2 is a bottom view of a bobbin structure of a magnetic circuit board stacking component in accordance with the present invention.

Referring further to FIG. 1, in one embodiment in accordance with the present invention, the bobbin structure 14 includes a first lower bobbin pin 54 extending from a first lower bobbin pin support such as rail 50. A second lower bobbin pin 64 extends from a second lower bobbin pin support or rail 60, as shown in FIG. 2. Referring again to FIG. 1, a third lower bobbin pin 56 extends from the first lower bobbin pin rail 50. A fourth lower bobbin pin 66 also extends from the second lower bobbin pin rail 60. Each lower bobbin pin 54, 64, 56, 66 generally extends in the same direction away from the bobbin structure 14. In one embodiment, each lower bobbin pin 54, 64, 56, 66 is adapted by size and shape for inserting into a terminal via 84 located on the second circuit board 82. Each lower bobbin pin 54, 64, 56, 66 may be attached to the second circuit board 82 by a soldered connection or inserted into a socket connector.

In one embodiment, a soldered connection between a bobbin pin and either the first circuit board 72 or second circuit board 82 can provide a mechanical or electrical connection, or both, between the magnetic component 10 and the first or second circuit boards 72, 82. In one embodiment, at least one upper bobbin pin 34, 44, 36, 46 is electrically connected to the conductive coil 16 positioned in the winding region 24 of the bobbin structure 14, shown in FIG. 2. In another embodiment in accordance with the present invention, at least one lower bobbin pin 54, 64, 56, 66 is electrically connected to the conductive coil 16 positioned in the winding region 24 of the bobbin structure 14, also shown in FIG. 2.

Referring again to FIG. 1, in another embodiment, at least one upper bobbin pin 34, 44, 36, 46 is electrically connected to at least one lower bobbin pin 54, 64, 56, 66 to provide an electrical connection between the first circuit board 72 and the second circuit board 82. As the term is used herein, a first conductor, or bobbin pin, is 'electrically connected' to a second conductor, or bobbin pin, where sufficient electrical contact exists between the conductors to allow a flow of electrons between the conductors. Also, as used herein, a first conductor is 'magnetically coupled' to a second conductor where a flow of current through the first conductor creates a magnetic field in a nearby core material that induces a flow of current through the second conductor.

Referring further to FIG. 1, in one embodiment, the first upper bobbin pin rail 30 may include a bobbin pin vent hole 22. The first upper bobbin pin rail 30 may also include a first upper bobbin pin standoff 32. The first upper bobbin pin standoff 32 is generally positioned near the first upper bobbin pin 34. In another embodiment, the first upper bobbin pin standoff 32 may be positioned at other locations on the first upper bobbin pin rail. In one embodiment, a second upper bobbin pin standoff 42 is positioned on the second upper bobbin pin rail 40 near the second upper bobbin pin 44. A third upper bobbin pin standoff 86 is positioned on the first upper bobbin pin rail 30 near the third upper bobbin pin 36, and a fourth upper bobbin pin standoff 90 is positioned on the second upper bobbin pin rail 40 near the fourth upper bobbin pin 46. In one embodiment, each upper bobbin pin standoff 32, 42, 86, 90 is molded onto the bobbin structure 14.

Referring now to FIG. 2, a bottom view of a bobbin structure 14 in accordance with present invention is generally shown. The bobbin structure 14 includes a winding region 24 and a conductive coil 16 positioned in the winding region 24.

Referring now to FIG. 2 in combination with FIG. 1, the bobbin structure 14 includes a first lower bobbin pin rail 50 and a second lower bobbin pin rail 60. A first lower bobbin pin 54 extends from the first lower bobbin pin rail 50. A first lower bobbin pin standoff 52 extends from the first lower bobbin pin rail 50 near the first lower bobbin pin 54. The first lower bobbin pin standoff 52 provides support to the first lower bobbin pin 54. A second lower bobbin pin 64 extends from second lower bobbin pin rail 60. A second lower bobbin pin standoff 62 also extends from the second lower bobbin pin rail 60. A third lower bobbin pin 56 extends from the first lower bobbin pin rail 50, and a third lower bobbin pin standoff 94 extends from the first lower bobbin pin rail 50. A fourth lower bobbin pin 66 extends from the second lower bobbin pin rail 60, and a fourth lower bobbin pin standoff 98 also extends from the second lower bobbin pin rail 60. In one embodiment, each lower bobbin pin standoff is molded onto the bobbin structure 14.

In one embodiment, each lower bobbin pin standoff 52, 62, 94, 98 is positioned on its respective lower bobbin pin rail 50, 60 adjacent to the winding region 54. In other embodiments, the first lower bobbin pin standoff 52 and the third lower bobbin pin standoff 94 may be placed at various other locations on the first lower bobbin pin rail 50. Similarly, in other embodiments, the second lower bobbin pin standoff 62 and the fourth lower bobbin pin standoff 98 may be positioned at other locations on the second lower bobbin pin rail 60. Also, other embodiments in accordance with the present invention may include additional or fewer bobbin pin standoffs located on each bobbin pin rail.

Figure 3:
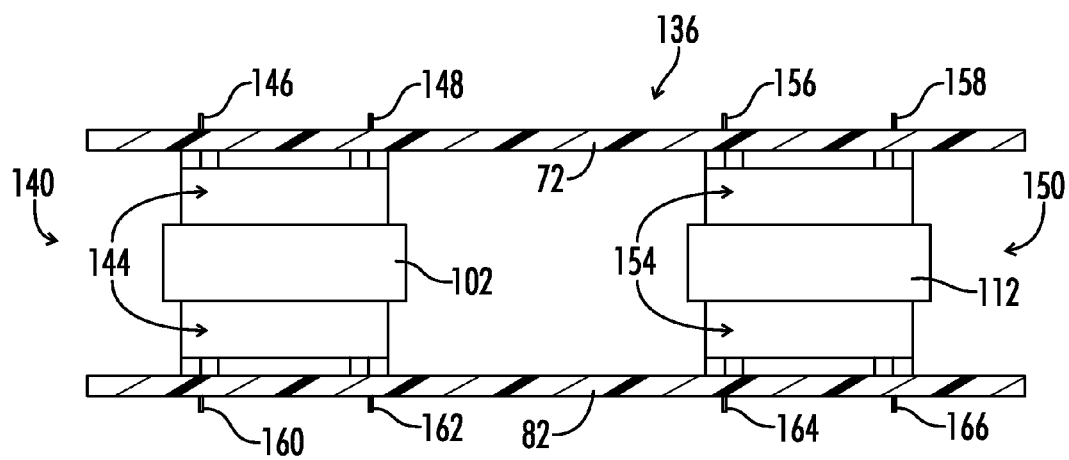
FIG. 3 is a side view of a circuit board assembly in accordance with the present invention.
Figure 4:
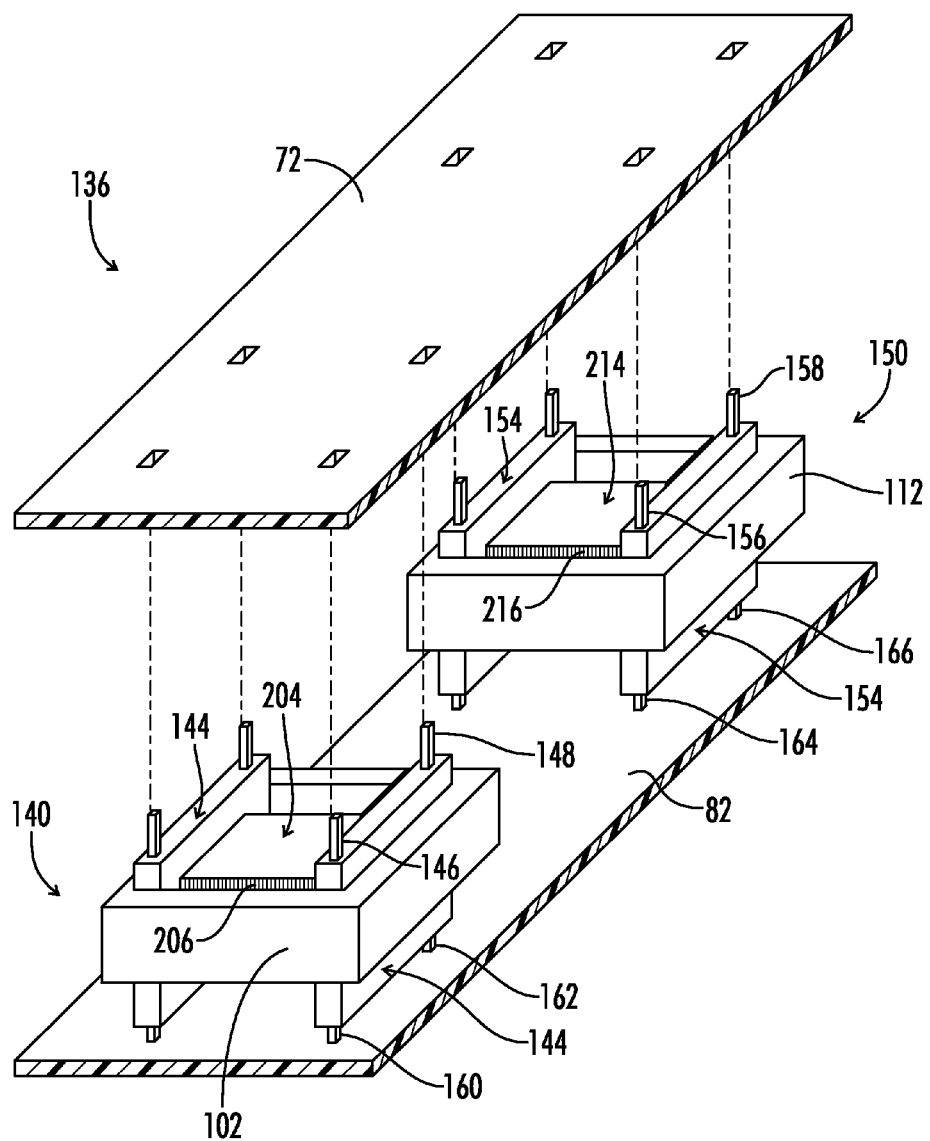
FIG. 4 is a perspective view of a circuit board assembly in accordance with the present invention.

Referring now to FIG. 3 and FIG. 4, a circuit board assembly 136 in accordance with the present invention is shown. The circuit board assembly 136 includes a first circuit board 72 and a second circuit board 82. In one embodiment the first and second circuit boards 72, 82 are printed circuit boards. In one embodiment, the first circuit board 72 may be a double-sided printed circuit board and the second circuit board 82 may be a single-sided printed circuit board. The first and second circuit boards 72, 82 are connected by a first magnetic component 140 and a second magnetic component 150. The first magnetic component 140 includes a first bobbin structure 144. The first magnetic component 140 also includes a first upper bobbin pin 146 and a second upper bobbin pin 148 extending from the first bobbin structure 144. The first magnetic component 140 also includes a first lower bobbin pin 160 and a second lower bobbin pin 162 extending from the first bobbin structure 144. A first core 102 is positioned on the first bobbin structure 144. In one embodiment, the first core 102 is a ferrite.

In one embodiment, shown in FIG. 4, the first magnetic component 140 includes a first winding region 204 and a first conductive winding 206. The first upper bobbin pin 146 or second upper bobbin pin 148 may be electrically connected to the first conductive winding 206. In another embodiment, the first upper bobbin pin 146 or the second upper bobbin pin 148 may be electrically connected to the first lower bobbin pin 160 or the second lower bobbin pin 162. In one embodiment, the first magnetic component 140 is a transformer.

Referring again to FIG. 3, the second magnetic component 150 includes a second bobbin structure 154 positioned between the first circuit board 72 and the second circuit board 82. The second magnetic component 150 includes a second core 112. In one embodiment the second core 112 is made of a ferrite. The second bobbin structure 154 includes a third upper bobbin pin 156 and a fourth upper bobbin pin 158. The second bobbin structure 154 also includes a third lower bobbin pin 164 and a fourth lower bobbin pin 166. In one embodiment, the upper bobbin pins 146, 148, 156, 158 are each soldered to the first circuit board 72, and each lower bobbin pin 160, 162, 164, 166 is soldered to the second circuit board 82. The third upper bobbin pin 156 or fourth upper bobbin pin 158 may be electrically connected to the third lower bobbin pin 164 or fourth lower bobbin pin 166.

In one embodiment, the second bobbin structure 154 includes a second winding region 214 and a second conductive coil 216 disposed about the second winding region 214, as shown in FIG. 4. The third or fourth upper bobbin pins 156, 158 may be electrically connected to the second conductive coil 216. In another embodiment, the third or fourth lower bobbin pins 164, 166 may be electrically connected to the second conductive coil 216. In other embodiments, the upper and lower bobbin pins may extend from either side of each bobbin structure for connection to the first or second circuit board. Additional upper and lower bobbin pins may also extend from the first bobbin structure 144 or second bobbin structure 154. In one embodiment, the second magnetic component 150 is a transformer. The first and second circuit boards 72, 82 typically include additional electronic circuit components.

The first magnetic component 140 and the second magnetic component 150 provide both mechanical support and electrical connectivity between the first circuit board 72 and the second circuit board 82. Electrical connectivity between the first and second circuit boards 72, 82 may be provided through magnetic coupling and/or through electrical connection.

Thus, although there have been described particular embodiments of the present invention of a new and useful magnetic circuit board stacking component, it is not intended that such references be construed as limitations upon the scope of this invention except as set forth in the following claims.

What is claimed is:

1. A circuit board apparatus, comprising: a first circuit board; a second circuit board positioned above and in spaced relation to the first circuit board; a first magnetic component comprising a first bobbin, a first conductive coil wound around the first bobbin, and a first core, the first magnetic component disposed between the first and second circuit boards; and a second magnetic component comprising a second bobbin, a second conductive winding wound around the bobbin, and a second core, the second magnetic component disposed between the first and second circuit boards, a first bobbin pin extending upwardly from the first bobbin~a second bobbin pin extending downwardly from the first bobbin; a third bobbin pin extending upwardly from the second bobbin, the first and third bobbin pins soldered to the second circuit board; and a fourth bobbin pin extending downwardly from the second bobbin, the second and fourth bobbin pins soldered to the first circuit board, wherein the second circuit board is stacked relative to the first circuit board on the first and second magnetic components; the first circuit board is a single-side printed circuit board; and the second circuit board is a double-side printed circuit board.

2. The apparatus of claim 1, wherein the first magnetic component is a bobbin-wound transformer.

3. The apparatus of claim 1, wherein the first core comprises ferrite.

4. The apparatus of claim 1, wherein the first magnetic component provides electrical connectivity between the first and second circuit boards.

5. The apparatus of claim 1, wherein the first and second magnetic components provide isolation between the first and second circuit boards.

6. The apparatus of claim 2, wherein the second magnetic component is a bobbin-wound transformer.

7. The apparatus of claim 3, wherein the second core comprises ferrite.

8. The apparatus of claim 4, wherein the second magnetic component provides electrical connectivity between the first and second circuit boards.

9. A circuit board apparatus, comprising: a first printed circuit board; a second printed circuit board having substantially the same shape as the first printed circuit board and stacked above the first printed circuit board in spaced relation thereto; a first transformer including a first bobbin disposed between the first and second printed circuit boards; a second transformer including a second bobbin disposed between the first and second printed circuit boards, the second transformer spaced from the first transformer;
  a first bobbin pin extending upwardly from the first bobbin; a second bobbin pin extending downwardly from the first bobbin;
  a third bobbin pin extending upwardly from the second bobbin, the first and third bobbin pins soldered to the second circuit board;
  a fourth bobbin pin extending downwardly from the second bobbin, the second and fourth bobbin pins soldered to the first circuit board, a first conductive coil disposed on the first bobbin; a second conductive coil disposed on the second bobbin; a first ferrite core positioned on the first bobbin; and a second ferrite core positioned on the second bobbin; wherein: the first printed circuit board is a single-side printed circuit board; and the second printed circuit board is a double-side printed circuit board.

10. The apparatus of claim 9, wherein:
the first and second circuit boards are magnetically coupled by the first transformer.

11. The apparatus of claim 10, wherein:
the first and second circuit boards are magnetically coupled by the second transformer.

12. A circuit board apparatus, comprising; a first printed circuit board; a first magnetic component disposed on the first printed circuit board and extending above the first printed circuit board, the first magnetic component including a first bobbin, a first conductive coil disposed on the first bobbin, and a first core positioned on the first bobbin; a second magnetic component disposed on the first printed circuit board and extending above the first printed circuit board, the second magnetic component including a second bobbin, a second conductive coil disposed on the second bobbin, and a second core positioned on the second bobbin; a second printed circuit board stacked above the first printed circuit board, wherein the first and second magnetic components are disposed between the first and second printed circuit boards;
  a first bobbin pin extending upwardly from the first bobbin; a second bobbin pin extending downwardly from the first bobbin; a third bobbin pin extending upwardly from the second bobbin, the first and third bobbin pins mechanically and electrically attached to the second circuit board; and a fourth bobbin pin extending downwardly from the second bobbin, the second and fourth bobbin pins mechanically and electrically attached to the first circuit board; wherein: the first printed circuit board is a single-side printed circuit board; and the second printed circuit board is a double-side printed circuit board.

13. The apparatus of claim 12, further comprising:
the first magnetic component is a first transformer; and
the second magnetic component is a second transformer, wherein the first and second circuit boards are magnetically coupled via both the first magnetic component and the second magnetic component.

\* \* \* \* \*